(12) United States Patent
Katrak et al.

(10) Patent No.: US 10,047,758 B2
(45) Date of Patent: Aug. 14, 2018

(54) SYSTEM FOR CONTROLLING OPERATION OF FIRST AND SECOND ELECTRIC FANS

(71) Applicant: LG Chem, Ltd., Seoul (KR)

(72) Inventors: Kerfegar K. Katrak, Fenton, MI (US); Kunal Tipnis, Troy, MI (US); Michael B. Mero, Oxford, MI (US)

(73) Assignee: LG Chem. Ltd., Seoul (KR)

( * ) Notice: Subject to any disclaimer, the term of this patent is extended or adjusted under 35 U.S.C. 154(b) by 258 days.

(21) Appl. No.: 15/247,282

(22) Filed: Aug. 25, 2016

(65) Prior Publication Data

US 2017/0363095 A1  Dec. 21, 2017

Related U.S. Application Data

(60) Provisional application No. 62/352,344, filed on Jun. 20, 2016.

(51) Int. Cl.
*F04D 27/00* (2006.01)
*F04D 25/06* (2006.01)
*F04D 25/16* (2006.01)
*F04D 29/32* (2006.01)

(52) U.S. Cl.
CPC ......... *F04D 27/004* (2013.01); *F04D 25/068* (2013.01); *F04D 25/0693* (2013.01); *F04D 25/166* (2013.01); *F04D 27/001* (2013.01); *F04D 29/325* (2013.01)

(58) Field of Classification Search
None
See application file for complete search history.

(56) References Cited

U.S. PATENT DOCUMENTS

| | | | | |
|---|---|---|---|---|
| 5,761,085 A | * | 6/1998 | Giorgio | G06F 1/206 361/679.4 |
| 6,318,965 B1 | * | 11/2001 | Nair | F04D 27/004 417/17 |
| 6,329,727 B1 | * | 12/2001 | Traveis | H02M 3/157 307/115 |
| 7,863,839 B2 | | 1/2011 | Schuricht et al. | |
| 8,853,986 B2 | | 10/2014 | Wiltsch | |
| 9,337,769 B2 | | 5/2016 | Gauthier | |
| 2003/0236594 A1 | * | 12/2003 | Frankel | G05D 23/1902 700/300 |
| 2008/0066541 A1 | * | 3/2008 | Burton | G01F 1/6965 73/204.15 |
| 2012/0223666 A1 | * | 9/2012 | Huang | F04D 27/004 318/472 |

* cited by examiner

*Primary Examiner* — Bentsu Ro
(74) *Attorney, Agent, or Firm* — Buckert Patent & Trademark Law Firm PC; John F. Buckert (57) ABSTRACT

A system for controlling operation of first and second electric fans is provided. The system includes a microcontroller that determines when first analog multiplexer is malfunctioning or a first channel of the first analog-to-digital converter is malfunctioning based on first values obtained from the first analog-to-digital converter. The first values are associated with at least one of a first speed signal associated with the first electric fan and a first driving voltage for the first electric fan that are received by the first analog multiplexer. The microcontroller modifies a control signal to induce the second electric fan to operate at a higher rotational speed when the first analog multiplexer is malfunctioning or the first channel of the first analog-to-digital converter is malfunctioning.

5 Claims, 8 Drawing Sheets

SYSTEM FOR CONTROLLING OPERATION OF FIRST AND SECOND ELECTRIC FANS

CROSS-REFERENCE TO RELATED APPLICATION

This application claims priority to U.S. Provisional Patent Application No. 62/352,344 filed on Jun. 20, 2016, the entire contents of which are hereby incorporated by reference herein.

BACKGROUND

The inventors herein have recognized a need for an improved system for controlling an operation of first and second electric fans. In particular, the system provides a technical effect of monitoring values from a first analog-to-digital converter associated with a first electric fan to determine whether to adjust an operational speed of the second electric fan, and further monitors values from a second analog-to-digital converter associated with the second electric fan to determine whether to adjust an operational speed of the first electric fan.

SUMMARY

A system for controlling operation of first and second electric fans in accordance with an exemplary embodiment is provided. The system includes a microcontroller having first and second analog-to-digital converters and first and second output ports. The system further includes a first fan driver circuit being electrically coupled to the first output port of the microcontroller via a first electrical line. The first fan driver circuit is further electrically coupled to the first electric fan. The system further includes a first speed sensor generating a first speed signal indicating a rotational speed of the first electric fan. The system further includes a first analog multiplexer having first and second input ports and an output port. The first input port of the first analog multiplexer is electrically coupled to the first electrical line. The second input port of the first analog multiplexer is electrically coupled to the first speed sensor. A first channel of the first analog-to-digital converter is electrically coupled to the output port of the first analog multiplexer. The system further includes a second fan driver circuit that is electrically coupled to the second output port of the microcontroller via a second electrical line. The second fan driver circuit is further electrically coupled to the second electric fan. The system further includes a second speed sensor generating a second speed signal indicating a rotational speed of the second electric fan. The system further includes a second analog multiplexer having first and second input ports and an output port. The first input port of the second analog multiplexer is electrically coupled to the second electrical line. The second input port of the second analog multiplexer is electrically coupled to the second speed sensor. A first channel of the second analog-to-digital converter is electrically coupled to the output port of the second analog multiplexer. The microcontroller is programmed to generate first and second control signals to induce the first and second fan driver circuits, respectively, to generate first and second driving voltages, respectively, to induce the first and second electric fans, respectively, to operate at first and second rotational speeds, respectively. The microcontroller is further programmed to determine when the first analog multiplexer is malfunctioning or the first channel of the first analog-to-digital converter is malfunctioning based on first values obtained from the first analog-to-digital converter. The first values are associated with at least one of the first speed signal and the first driving voltage that are received by the first analog multiplexer.

A system for controlling operation of first and second electric fans in accordance with another exemplary embodiment is provided. The system includes a microcontroller having first and second analog-to-digital converters and first and second output ports. The system further includes a first fan driver circuit that is electrically coupled to the first output port of the microcontroller via a first electrical line. The first fan driver circuit is further electrically coupled to the first electric fan. The system further includes a first speed sensor generating a first speed signal indicating a rotational speed of the first electric fan. The system further includes a first analog multiplexer having first and second input ports and an output port. The first input port of the first analog multiplexer is electrically coupled to the first electrical line. The second input port of the first analog multiplexer is electrically coupled to the first speed sensor. A first channel of the first analog-to-digital converter is electrically coupled to the output port of the first analog multiplexer. The system further includes a second fan driver circuit that is electrically coupled to the second output port of the microcontroller via a second electrical line. The second fan driver circuit is further electrically coupled to the second electric fan. The system further includes a second speed sensor generating a second speed signal indicating a rotational speed of the second electric fan. The system further includes a second analog multiplexer having first and second input ports and an output port. The first input port of the second analog multiplexer is electrically coupled to the second electrical line. The second input port of the second analog multiplexer is electrically coupled to the second speed sensor. A first channel of the second analog-to-digital converter is electrically coupled to the output port of the second analog multiplexer. The microcontroller is programmed to generate first and second control signals to induce the first and second fan driver circuits, respectively, to generate first and second driving voltages, respectively, to induce the first and second electric fans, respectively, to operate at first and second rotational speeds, respectively. The microcontroller is programmed to determine when the second analog multiplexer is malfunctioning or the first channel of the second analog-to-digital converter is malfunctioning based on first values obtained from the second analog-to-digital converter. The first values are associated with at least one of the second speed signal and the second driving voltage that are received by the second analog multiplexer.

DETAILED DESCRIPTION

Figure 1:
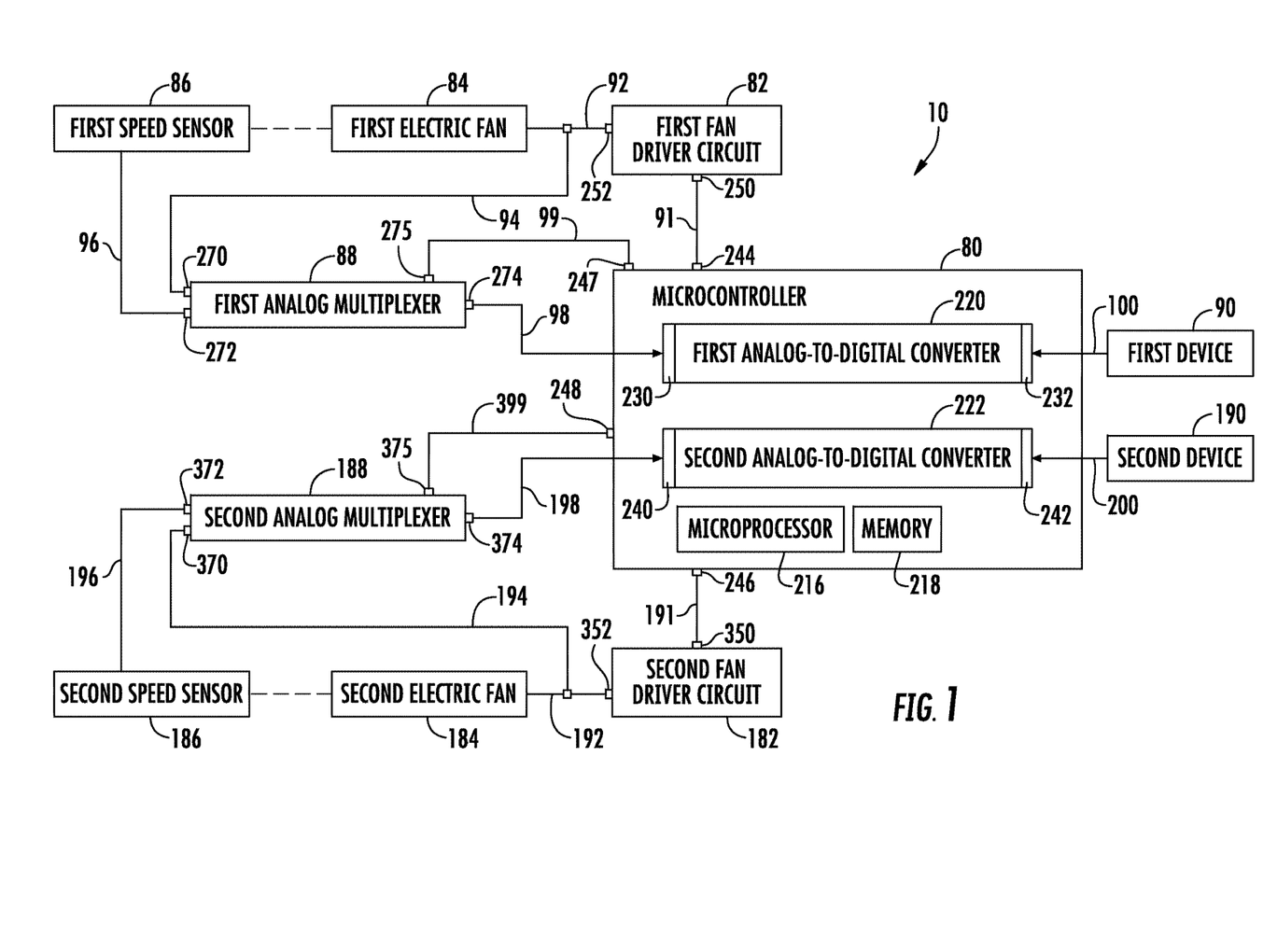
FIG. 1 is a schematic of a system for controlling operation of first and second electric fans in accordance with an exemplary embodiment.
Figure 2:
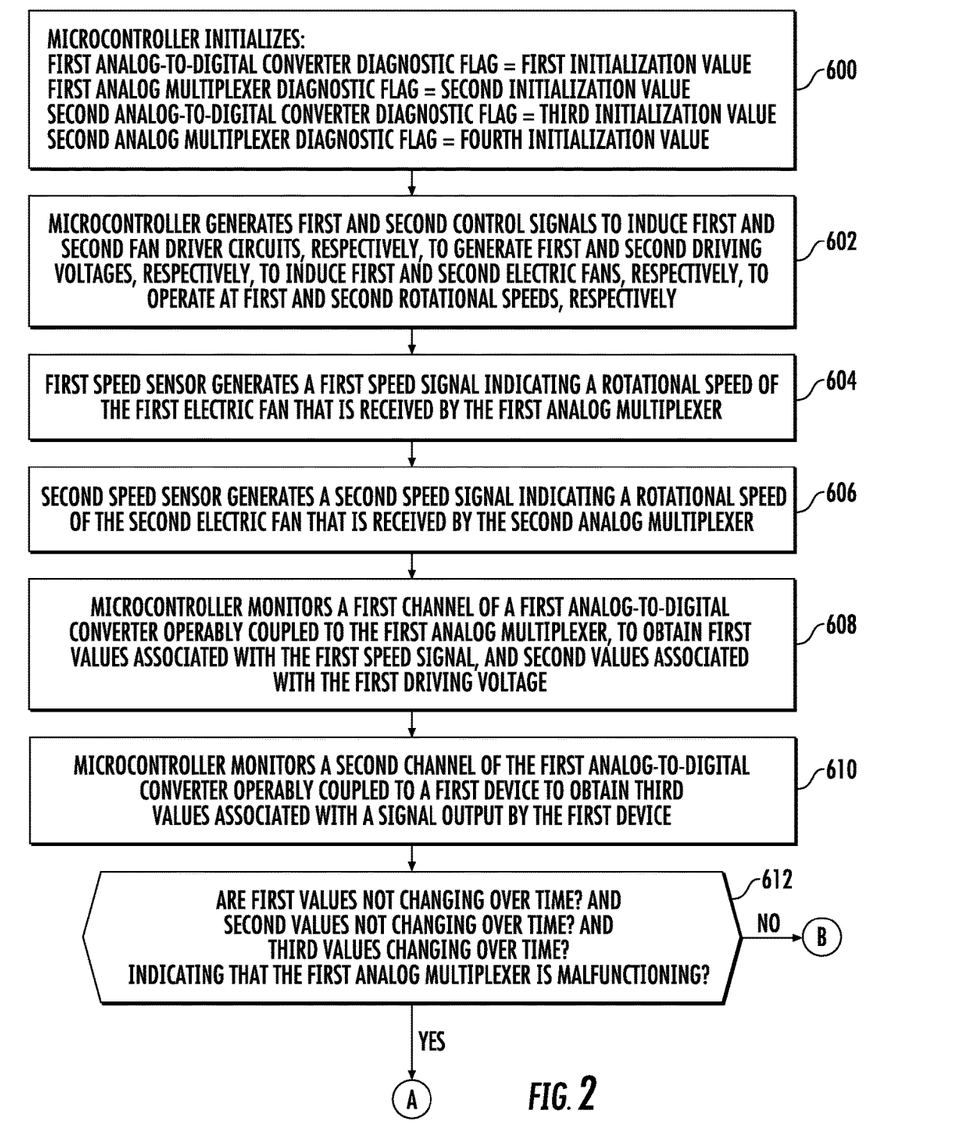
FIGS. 2-8 are flowcharts of a method for controlling operation of first and second electric fans in accordance with another exemplary embodiment.
Figure 3:
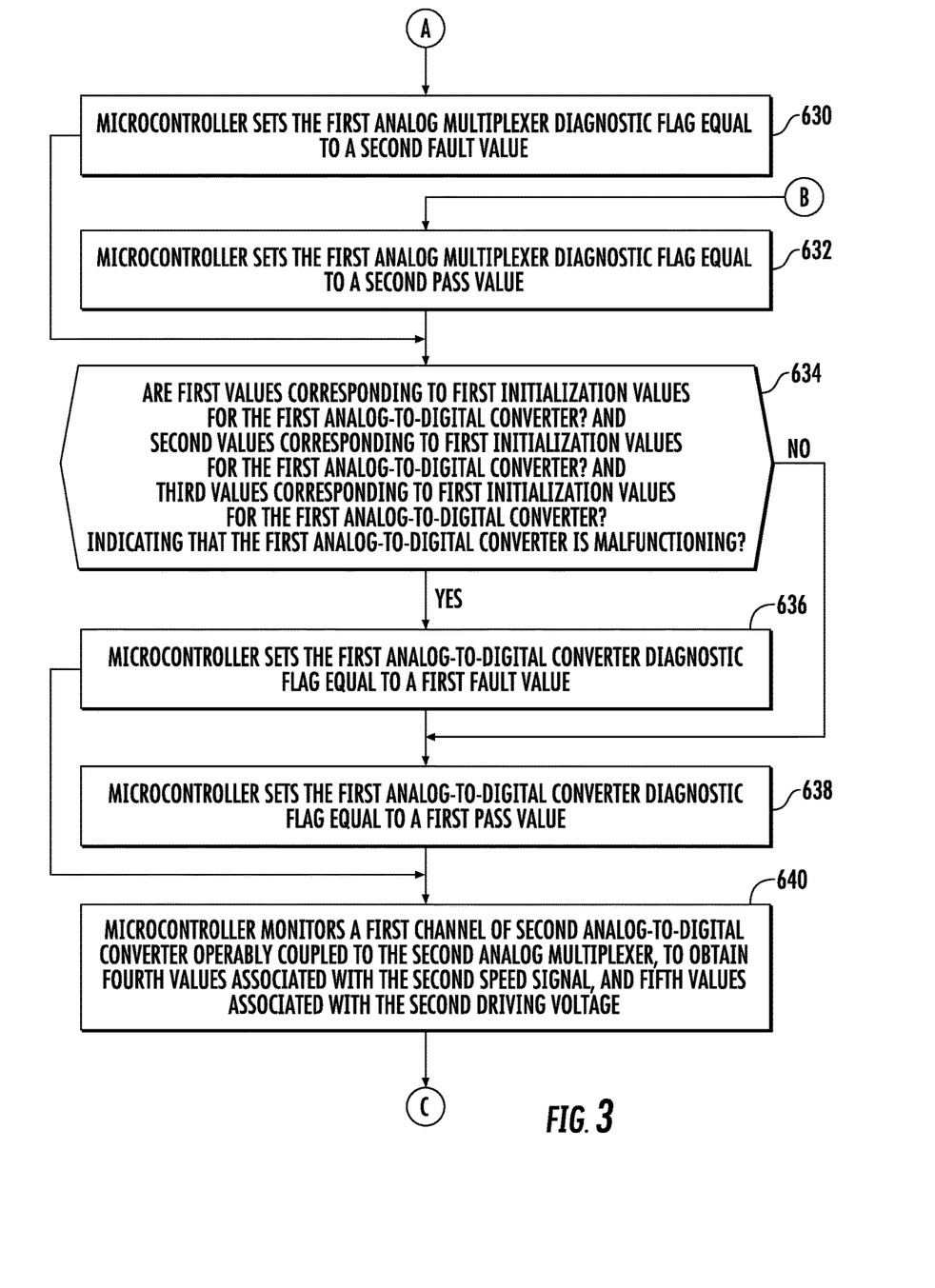
Figure 4:
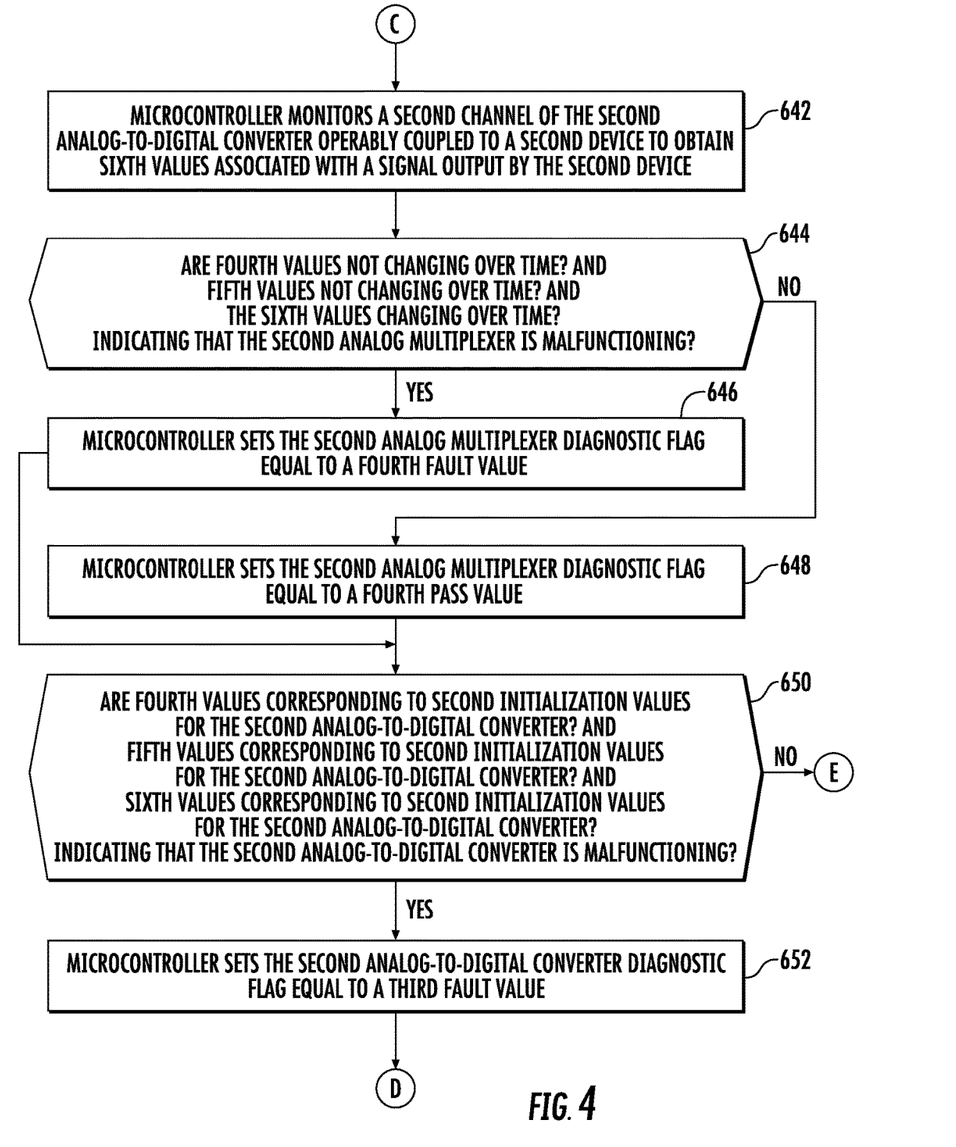
Figure 5:
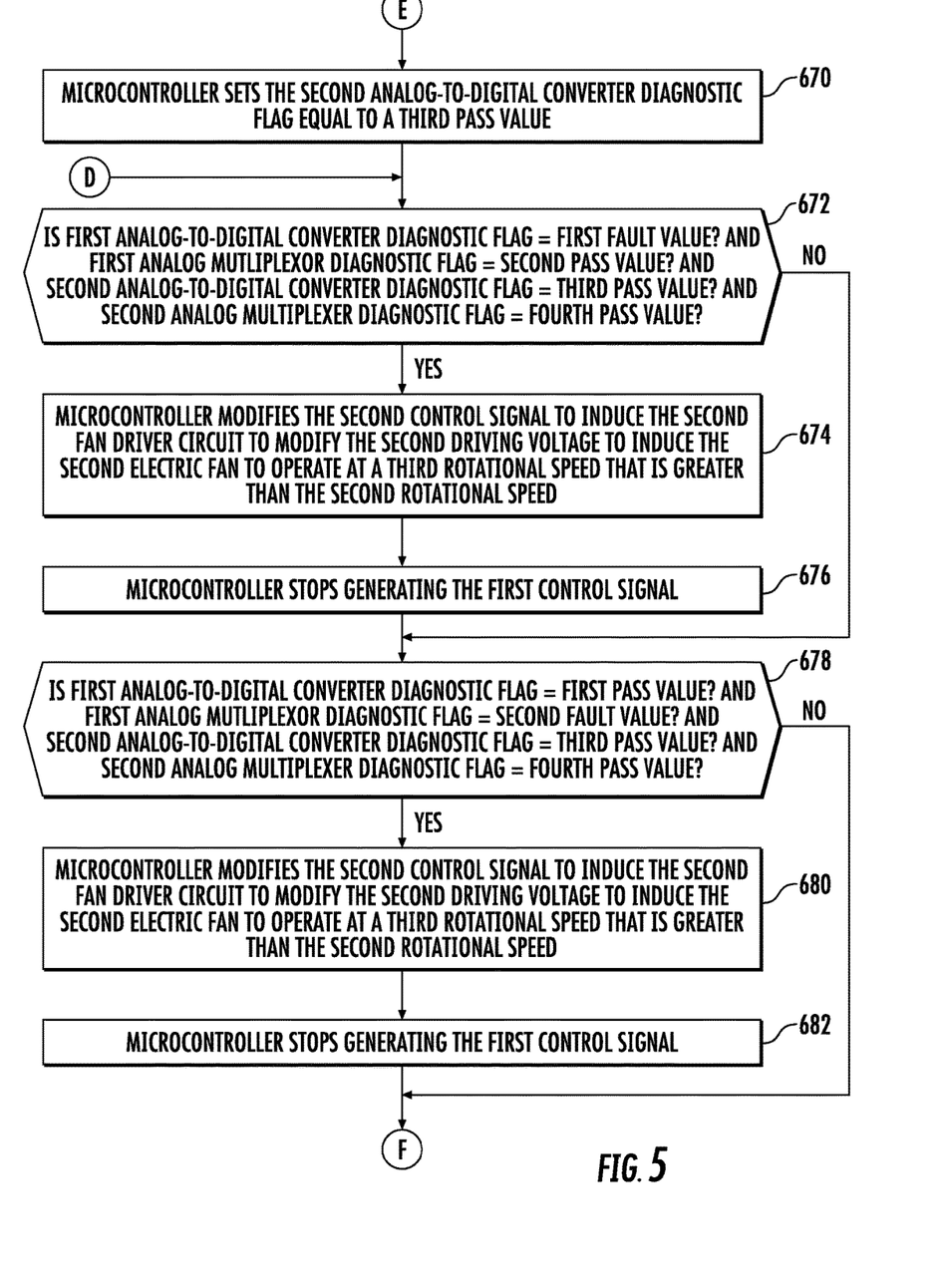
Figure 6:
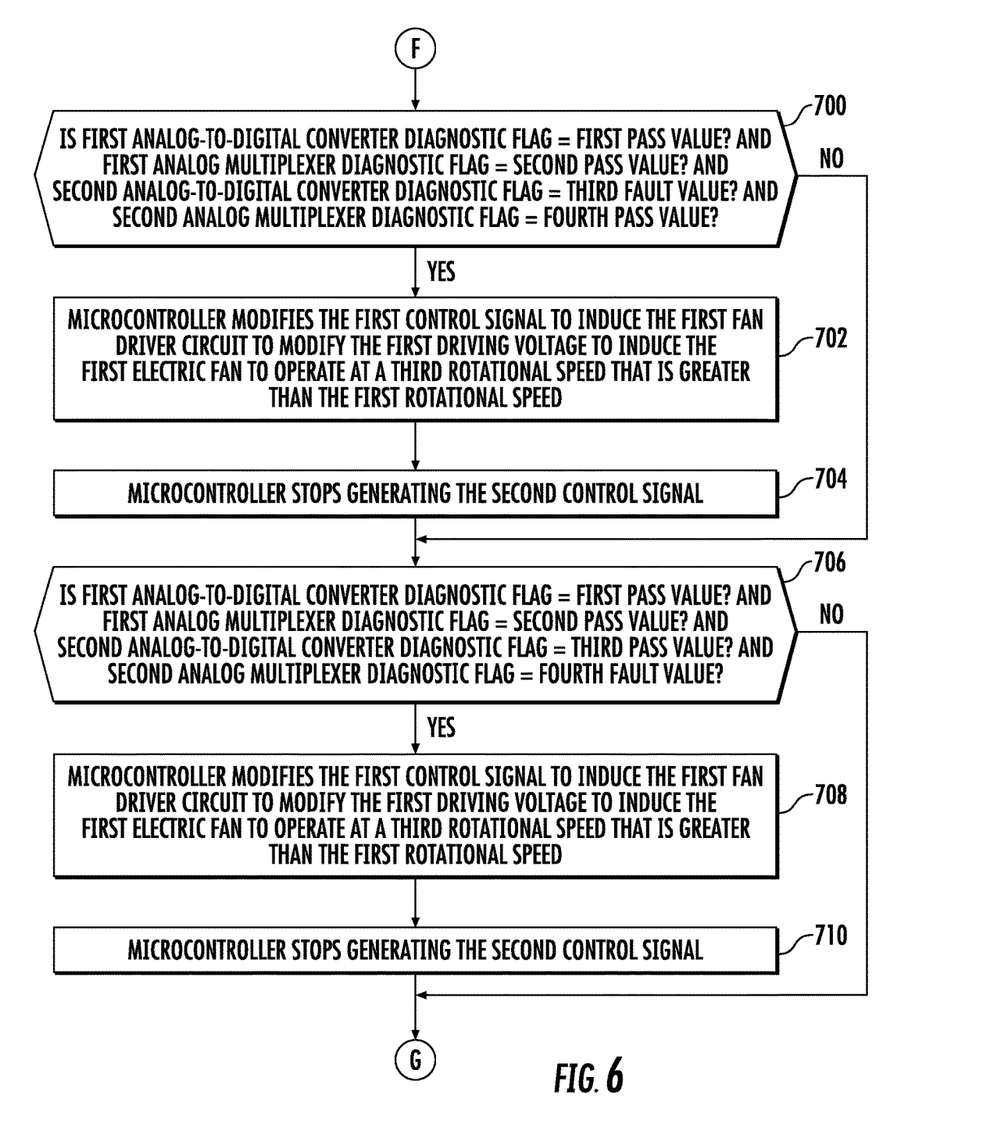
Figure 7:
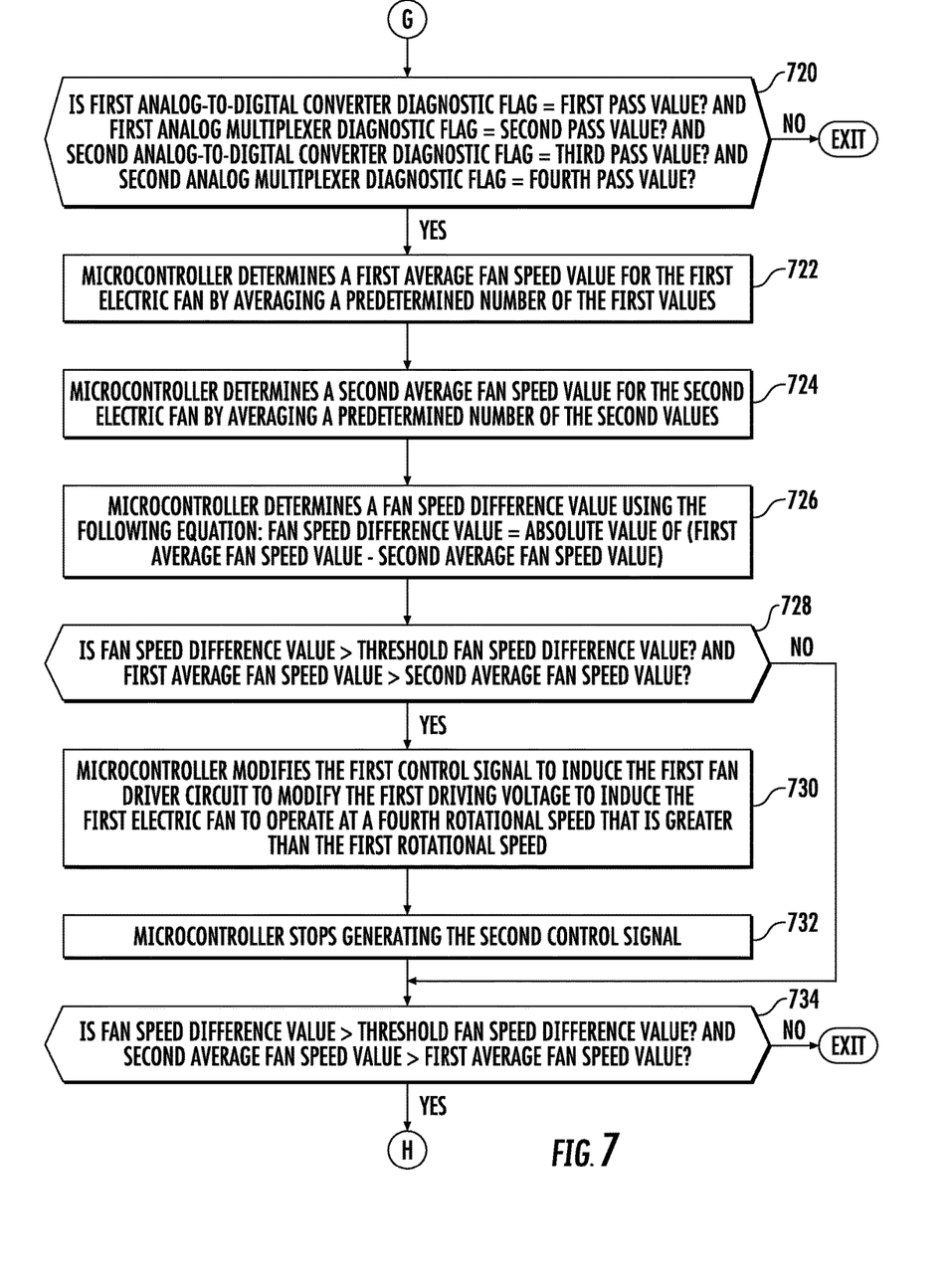
Figure 8:
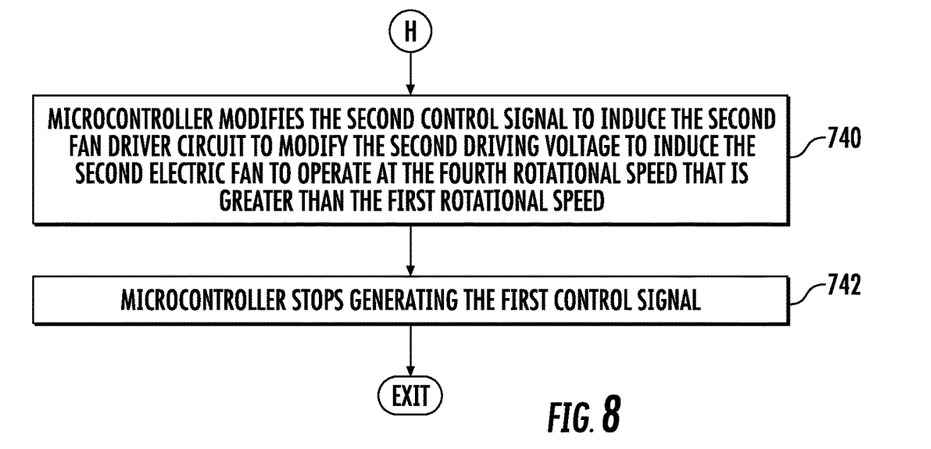

Referring to FIG. 1, a system 10 for controlling operation of first and second electric fans 84, 184 in accordance with an exemplary embodiment is provided. The system 10 includes a microcontroller 80, a first fan driving circuit 82, a first electric fan 84, a first speed sensor 86, a first analog multiplexer 88, a first device 90, electrical lines 92, 94, 96, 98, 100, a second fan driving circuit 182, a second electric fan 184, a second speed sensor 186, a second analog multiplexer 188, a second device 190, and electrical lines 192, 194, 196, 198, 200.

The microcontroller 80 includes a microprocessor 216, a memory 218, a first analog-to-digital converter 220, a second analog-to-digital converter 222, and first, second, third and fourth output ports 244, 246, 247, 248. The microcontroller 80 is programmed to perform diagnostic steps (described in flowcharts herein) utilizing the microprocessor 216 which executes software instructions stored in the memory 218. The microprocessor 216 operably communicates with the memory 218, the first and second analog-to-digital converters 220, 222, and the first, second, third, and fourth output ports 244, 246, 247, 248.

The first analog-to-digital converter 220 has a first channel 230 and a second channel 232. The first channel 230 is electrically coupled to an output port 274 of the first analog multiplexer 88 utilizing the electrical line 98. The second channel 232 is electrically coupled to the first device 90 utilizing an electrical line 100.

The second analog-to-digital converter 222 has a first channel 240 and a second channel 242. The first channel 240 is electrically coupled to an output port 374 of the second analog multiplexer 188 utilizing the electrical line 198. The second channel 242 is electrically coupled to the second device 190 utilizing the electrical line 200.

The first driving circuit 82 is provided to generate a first driving voltage that is received by the first electric fan 84 to induce the first electric fan 84 to rotate fan blades therein. The first fan driving circuit 82 has an input node 250 and an output node 252. The input node 250 is electrically coupled to the first output port 244 of the microcontroller 80 utilizing the electrical line 91. The output node 252 is electrically coupled to the first electric fan 84 utilizing the electrical line 92. The electrical line 94 is electrically coupled to and between the electrical line 92 and a first input port 270 of the first analog multiplexer 88.

The first speed sensor 86 is operably coupled to the first electric fan 84. The first speed sensor 86 generates a first speed signal indicating a rotational speed of fan blades within the first electric fan 86, that is received by the first analog multiplexer 88. In particular, the first speed sensor 86 is electrically coupled to a second input port 272 of the first analog multiplexer 88 utilizing the electrical line 96.

The first analog multiplexer 88 is provided to send the first driving voltage or the first speed signal at first and second times, respectively, to the first channel 230 of the first analog-to-digital converter 220. The first analog multiplexer 88 includes the first input port 270, the second input port 272, the output port 274, and the select port 275. As discussed above, the first input port 270 is electrically coupled to the electrical line 92 for receiving the first driving voltage. Further, the second input port 272 is electrically coupled to the first speed sensor 86 for receiving the first speed signal. Also, the output port 274 is electrically coupled to the first channel 230 of the first analog-to-digital converter 220. The select port 275 is electrically coupled to the third output port 247 of the microcontroller 80 via the electrical line 99. The microcontroller 80 generates a first select signal at the third output port 247 that is received by the select port 275 to select the first driving voltage from the first fan driver circuit 82—and in response the first analog multiplexer 88 routes the first driving voltage through the first analog multiplexer 88 to the first channel 230 of the first analog-to-digital converter 220. Further, the microcontroller 80 generates a second select signal at the third output port 247 that is received by the select port 275 to select the first speed signal from the first speed sensor 86—and in response the first analog multiplexer 88 routes the first speed signal through the first analog multiplexer 88 to the first channel 230 of the first analog-to-digital converter 220.

The second driving circuit 182 is provided to generate a second driving voltage that is received by the second electric fan 184 to induce the second electric fan 184 to rotate fan blades therein. The second fan driving circuit 182 has an input node 350 and an output node 352. The input node 30 is electrically coupled to the second output port 246 of the microcontroller 80 utilizing the electrical line 191. The output node 352 is electrically coupled to the second electric fan 184 utilizing the electrical line 192. The electrical line 194 is electrically coupled to and between the electrical line 192 and a first input port 370 of the second analog multiplexer 188.

The second speed sensor 186 is operably coupled to the second electric fan 184. The second speed sensor 186 generates a second speed signal indicating a rotational speed of fan blades within the second electric fan 186 that is received by the second analog multiplexer 188. In particular, the second speed sensor 186 is electrically coupled to a second input port 372 of the second analog multiplexer 188 utilizing the electrical line 196.

The second analog multiplexer 188 is provided to send the second driving voltage and the second speed signal at first and second times, respectively, to the first channel 240 of the second analog-to-digital converter 222. The second analog multiplexer 188 includes the first input port 370, the second input port 372, the output port 374, and the select port 375. As discussed above, the first input port 370 is electrically coupled to the electrical line 192 for receiving the second driving voltage. Further, the second input port 372 is electrically coupled to the second speed sensor 186 for receiving the second speed signal. Also, the output port 374 is electrically coupled to the first channel 240 of the second analog-to-digital converter 222. The select port 375 is electrically coupled to the fourth output port 248 of the microcontroller 80 via the electrical line 399. The microcontroller 80 generates a third select signal at the fourth output port 248 that is received by the select port 375 to select the second driving voltage from the second fan driver circuit 182—and in response the second analog multiplexer 188 routes the second driving voltage through the second analog multiplexer 188 to the first channel 240 of the second analog-to-digital converter 222. Further, the microcontroller 80 generates a fourth select signal at the fourth output port 248 that is received by the select port 375 to select the second speed signal from the second speed sensor 186—and in response the second analog multiplexer 188 routes the second speed signal through the second analog multiplexer 188 to the first channel 240 of the second analog-to-digital converter 222.

Referring to FIGS. 1-8, a flowchart of a method for controlling operation of the first and second electric fans 84, 184 in accordance with another exemplary embodiment is provided.

At step 600, the microcontroller 80 initializes:
first analog-to-digital converter diagnostic flag=first initialization value
first analog multiplexer diagnostic flag=second initialization value
second analog-to-digital converter diagnostic flag=third initialization value
second analog multiplexer diagnostic flag=fourth initialization value. After step 600, the method advances to step 602.

At step 602, the microcontroller 80 generates first and second control signals to induce first and second fan driver circuits 82, 182, respectively, to generate first and second driving voltages, respectively, to induce first and second electric fans 84, 184, respectively, to operate at first and second rotational speeds, respectively. After step 602, the method advances to step 604.

At step 604, the first speed sensor 86 generates a first speed signal indicating a rotational speed of the first electric fan 84 that is received by the first analog multiplexer 88. After step 604, the method advances to step 606.

At step 606, the second speed sensor 186 generates a second speed signal indicating a rotational speed of the second electric fan 184 that is received by the second analog multiplexer 188. After step 606, the method advances to step 608.

At step 608, the microcontroller 80 monitors a first channel 230 of a first analog-to-digital converter 220 operably coupled to the first analog multiplexer 88, to obtain first values associated with the first speed signal, and second values associated with the first driving voltage. After step 608, the method advances to step 610.

At step 610, the microcontroller 80 monitors a second channel 232 of the first analog-to-digital converter 220 operably coupled to the first device 90 to obtain third values associated with a signal output by the first device 90. After step 610, the method advances to step 612.

At step 612, the microcontroller 80 makes a determination as to whether the first values are not changing over time, and whether the second values are not changing over time, and whether the third values are changing over time, indicating that the first analog multiplexer 88 is malfunctioning. If the value of step 612 equals "yes", the method advances to step 630. Otherwise, the method advances to step 632.

At step 630, the microcontroller 80 sets the first analog multiplexer diagnostic flag equal to a second fault value. After step 630, the method advances to step 634.

Referring again to step 612, if the value of step 612 equals "no", the method advances to step 632. At step 632, the microcontroller 80 sets the first analog multiplexer diagnostic flag equal to a second pass value. After step 632, the method advances to step 634.

At step 634, the microcontroller 80 makes a determination as to whether the first values correspond to first initialization values for the first analog-to-digital converter 220, and whether the second values correspond to first initialization values for the first analog-to-digital converter, and whether the third values correspond to first initialization values for the first analog-to-digital converter, indicating that the first analog-to-digital converter 220 is malfunctioning. If the value of step 634 equals "yes", the method advances to step 636. Otherwise, the method advances to step 638.

At step 636, the microcontroller 80 sets the first analog-to-digital converter diagnostic flag equal to a first fault value. After step 636, the method advances to step 640.

Referring again to step 634, if the value of step 634 equals "no", the method advances to step 638. At step 638, the microcontroller 80 sets the first analog-to-digital converter diagnostic flag equal to a first pass value. After step 638, the method advances to step 640.

At step 640, the microcontroller 80 monitors a first channel 240 of the second analog-to-digital converter 222 operably coupled to the second analog multiplexer 188, to obtain fourth values associated with the second speed signal, and fifth values associated with the second driving voltage. After step 640, the method advances to step 642.

At step 642, the microcontroller 80 monitors the second channel 242 of the second analog-to-digital converter 222 operably coupled to the second device 190 to obtain sixth values associated with a signal output by the second device 190. After step 642, the method advances to step 644.

At step 644, the microcontroller 80 makes a determination as to whether the fourth values are not changing over time, and whether the fifth values are not changing over time, and whether the sixth values are changing over time, indicating that the second analog multiplexer 188 is malfunctioning. If the value of step 644 equals "yes", the method advances to step 646. Otherwise, the method advances to step 648.

At step 646, the microcontroller 80 sets the second analog multiplexer diagnostic flag equal to a fourth fault value. After step 646, the method advances to step 650.

Referring again to step 644, if the value of step 644 equals "no", the method advances to step 648. At step 648, the microcontroller 80 sets the second analog multiplexer diagnostic flag equal to a fourth pass value. After step 648, the method advances to step 650.

At step 650, the microcontroller 80 makes a determination as to whether the fourth values correspond to second initialization values for the second analog-to-digital converter 188, and whether the fifth values correspond to second initialization values for the second analog-to-digital converter 188, and whether the sixth values correspond to second initialization values for the second analog-to-digital converter 188, indicating that the second analog-to-digital converter 188 is malfunctioning. If the value of step 650 equals "yes", the method advances to step 652. Otherwise, the method advances to step 670.

At step 652, the microcontroller 80 sets the second analog-to-digital converter diagnostic flag equal to a third fault value. After step 652, the method advances to step 672.

Referring again to step 650, if the value of step 650 equals "no", the method advances to step 670. At step 670, the microcontroller 80 sets the second analog-to-digital converter diagnostic flag equal to a third pass value. After step 670, the method advances to step 672.

At step 672, the microcontroller 80 makes a determination as to whether the first analog-to-digital converter diagnostic flag is equal to the first fault value, and whether the first analog multiplexer diagnostic flag is equal to the second pass value, and whether the second analog-to-digital converter diagnostic flag is equal to the third pass value, and whether the second analog multiplexer diagnostic flag is equal to the fourth pass value. If the value of step 672 equals "yes", the method advances to step 674. Otherwise, the method advances to step 678.

At step 674, the microcontroller 80 modifies the second control signal to induce the second fan driver circuit 182 to modify the second driving voltage to induce the second electric fan 184 to operate at a third rotational speed that is greater than the second rotational speed. After step 674, the method advances to step 676.

At step 676, the microcontroller 80 stops generating the first control signal. After step 676, the method advances to step 678.

At step 678, the microcontroller 80 makes a determination as to whether the first analog-to-digital converter diagnostic flag is equal to the first pass value, and whether the first analog multiplexer diagnostic flag is equal to the second fault value, and whether the second analog-to-digital converter diagnostic flag is equal to the third pass value, and whether the second analog multiplexer diagnostic flag is equal to the fourth pass value. If the value of step 678 equals "yes", the method advances to step 680. Otherwise, the method advances to step 700.

At step 680, the microcontroller 80 modifies the second control signal to induce the second fan driver circuit 182 to modify the second driving voltage to induce the second electric fan 184 to operate at a third rotational speed that is greater than the second rotational speed. After step 680, the method advances to step 682.

At step 682, the microcontroller 80 stops generating the first control signal. After step 682, the method advances to step 700.

At step 700, the microcontroller 80 makes a determination as to whether the first analog-to-digital converter diagnostic flag is equal to the first pass value, and whether the first analog multiplexer diagnostic flag is equal to the second pass value, and whether the second analog-to-digital converter diagnostic flag is equal to the third fault value, and whether the second analog multiplexer diagnostic flag is equal to the fourth pass value. If the value of step 700 equals "yes", the method advances to step 702. Otherwise, the method advances to step 706.

At step 702, the microcontroller 80 modifies the first control signal to induce the first fan driver circuit 82 to modify the first driving voltage to induce the first electric fan 84 to operate at a third rotational speed that is greater than the first rotational speed. After step 702, the method advances to step 704.

At step 704, the microcontroller 80 stops generating the second control signal. After step 704, the method advances to step 706.

At step 706, the microcontroller 80 makes a determination as to whether the first analog-to-digital converter diagnostic flag is equal to the first pass value, and whether the first analog multiplexer diagnostic flag is equal to the second pass value, and whether the second analog-to-digital converter diagnostic flag is equal to the third pass value, and whether the second analog multiplexer diagnostic flag is equal to the fourth fault value. If the value of step 706 equals "yes", the method advances to step 708. Otherwise, the method advances to step 720.

At step 708, the microcontroller 80 modifies the first control signal to induce the first fan driver circuit 82 to modify the first driving voltage to induce the first electric fan 84 to operate at a third rotational speed that is greater than the first rotational speed. After step 708, the method advances to step 710.

At step 710, the microcontroller 80 stops generating the second control signal. After step 710, the method advances to step 720.

At step 720, the microcontroller 80 makes determination as to whether the first analog-to-digital converter diagnostic flag is equal to the first pass value, and whether the first analog multiplexer diagnostic flag is equal to the second pass value, and whether the second analog-to-digital converter diagnostic flag is equal to the third pass value, and whether the second analog multiplexer diagnostic flag is equal to the fourth pass value. If the value of step 720 equals "yes", the method advances to step 722. Otherwise, the method exited.

At step 722, the microcontroller 80 determines a first average fan speed value for the first electric fan 84 by averaging a predetermined number of the first values. After step 722, the method advances to step 724.

At step 724, the microcontroller 80 determines a second average fan speed value for the second electric fan 184 by averaging a predetermined number of the second values. After step 724, the method advances to step 726.

At step 726, the microcontroller 80 determines a fan speed difference value using the following equation: fan speed difference value=absolute value of (first average fan speed value−second average fan speed value). After step 726, the method advances to step 728.

At step 728, the microcontroller 80 makes a determination as to whether the fan speed difference value is greater than a threshold fan speed difference value, and whether the first average fan speed value is greater than the second average fan speed value. If the value of step 728 equals "yes", the method advances to step 730. Otherwise, the method advances to step 734.

At step 730, the microcontroller 80 modifies the first control signal to induce the first fan driver circuit 82 to modify the first driving voltage to induce the first electric fan 84 to operate at a fourth rotational speed that is greater than the first rotational speed. After step 730, the method advances to step 732.

At step 732, the microcontroller 80 stops generating the second control signal. After step 732, the method advances to step 734.

At step 734, the microcontroller 80 makes a determination as to whether the fan speed difference value is greater than the threshold fan speed difference value, and whether the second average fan speed value is greater than the first average fan speed value. If the value of step 734 equals "yes", the method advances to step 740. Otherwise, the method is exited.

At step 740, the microcontroller 80 modifies the second control signal to induce the second fan driver circuit 182 to modify the second driving voltage to induce the second electric fan 184 to operate at the fourth rotational speed that is greater than the first rotational speed. After step 740, the method advances to step 742.

At step 742, the microcontroller 80 stops generating the first control signal. After step 742, the method is exited.

The system for controlling first and second electric fans described herein provides a substantial advantage over other systems and methods. In particular, the system provides a technical effect of monitoring values from a first analog-to-digital converter associated with the first electric fan to determine whether to adjust an operational speed of the second electric fan, and monitors values from a second analog-to-digital converter associated with the second electric fan to determine whether to adjust an operational speed of the first electric fan.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A system for controlling operation of a first electric fan, comprising:
   a microcontroller;
   a first fan driver circuit being electrically coupled to a first output port of the microcontroller via a first electrical line, and being further electrically coupled to the first electric fan via a second electrical line;

a first speed sensor generating a first speed signal indicating a rotational speed of the first electric fan;

a first analog multiplexer having a first input port being electrically coupled to the second electrical line, and a second input port being electrically coupled to the first speed sensor;

a first channel of the first analog-to-digital converter being electrically coupled to the output port of the first analog multiplexer;

the microcontroller generating a first control signal to induce the first fan driver circuit to generate a first driving voltage to induce the first electric fan to operate at a first rotational speed; and the microcontroller determining when the first analog multiplexer is malfunctioning or the first channel of the first analog-to-digital converter is malfunctioning based on first values obtained from the first analog-to-digital converter, the first values being associated with at least one of the first speed signal and the first driving voltage that are received by the first analog multiplexer.

2. The system of claim 1, further comprising:

a second fan driver circuit being electrically coupled to a second output port of the microcontroller via a third electrical line, and being further electrically coupled to a second electric fan via a fourth electrical line;

a second speed sensor generating a second speed signal indicating a rotational speed of the second electric fan;

a second analog multiplexer having a first input port being electrically coupled to the fourth electrical line, and a second input port being electrically coupled to the second speed sensor;

a first channel of the second analog-to-digital converter being electrically coupled to an output port of the second analog multiplexer; and the microcontroller generating a second control signal to induce the second fan driver circuit to generate a second driving voltage to induce the second electric fan to operate at a second rotational speed.

3. The system of claim 2, wherein the microcontroller modifies the second control signal to induce the second fan driver circuit to modify the second driving voltage to induce the second electric fan to operate at a third rotational speed that is greater than the second rotational speed, when the first analog multiplexer is malfunctioning or the first channel of the first analog-to-digital converter is malfunctioning.

4. The system of claim 2, wherein the microcontroller determining when the second analog multiplexer is malfunctioning or the first channel of the second analog-to-digital converter is malfunctioning based on second values obtained from the second analog-to-digital converter, the second values being associated with at least one of the second speed signal and the second driving voltage that are received by the second analog multiplexer.

5. The system of claim 4, wherein the microcontroller modifying the first control signal to induce the first fan driver circuit to modify the first driving voltage to induce the first electric fan to operate at a third rotational speed that is greater than the first rotational speed, when the second analog multiplexer is malfunctioning or the first channel of the second analog-to-digital converter is malfunctioning.

* * * * *